United States Patent
Oh et al.

(12)

(10) Patent No.: US 10,276,092 B2
(45) Date of Patent: Apr. 30, 2019

(54) DISPLAY APPARATUS

(71) Applicant: SAMSUNG DISPLAY CO., LTD., Yongin-si, Gyeonggi-do (KR)

(72) Inventors: Jinseok Oh, Yongin-si (KR); Deukjong Kim, Yongin-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 52 days.

(21) Appl. No.: 15/333,238

(22) Filed: Oct. 25, 2016

(65) Prior Publication Data

US 2017/0316739 A1 Nov. 2, 2017

(30) Foreign Application Priority Data

Apr. 28, 2016 (KR) .................. 10-2016-0052324

(51) Int. Cl.
| | | |
|---|---|---|
| *G09G 3/3233* | (2016.01) | |
| *G09G 3/3266* | (2016.01) | |
| *G09G 3/3283* | (2016.01) | |
| *H01L 27/12* | (2006.01) | |
| *H01L 27/32* | (2006.01) | |
| *H01L 23/522* | (2006.01) | |
| *H01L 23/528* | (2006.01) | |

(52) U.S. Cl.
CPC ......... *G09G 3/3233* (2013.01); *G09G 3/3266* (2013.01); *G09G 3/3283* (2013.01); *H01L 27/1222* (2013.01); *H01L 27/3262* (2013.01); *H01L 27/3276* (2013.01); *G09G 2300/0809* (2013.01); *H01L 23/5225* (2013.01); *H01L 23/5286* (2013.01); *H01L 27/124* (2013.01); *H01L 27/3272* (2013.01)

(58) Field of Classification Search
CPC .............. G09G 3/3233; G09G 3/3283; H01L 27/3276; H01L 27/1222; H01L 23/5225; H01L 27/3262
See application file for complete search history.

(56) References Cited

U.S. PATENT DOCUMENTS

| | | | |
|---|---|---|---|
| 6,762,564 B2 | 7/2004 | Noguchi et al. | |
| 8,188,941 B2 | 5/2012 | Iida et al. | |
| 2002/0140364 A1* | 10/2002 | Inukai .................. | G09G 3/2074 315/169.3 |

(Continued)

FOREIGN PATENT DOCUMENTS

| | | |
|---|---|---|
| JP | 2003-330387 A | 11/2003 |
| JP | 2008-129157 A | 6/2008 |
| JP | 2015-056375 A | 3/2015 |

*Primary Examiner* — Shaheda A Abdin
(74) *Attorney, Agent, or Firm* — Lee & Morse, P.C.

(57) ABSTRACT

A display apparatus including a plurality of pixel electrodes, a plurality of circuit units in one-to-one correspondence with the plurality of pixel electrodes, respectively, each of the plurality of circuit units being electrically connected to a corresponding one of the plurality of pixel electrodes, a plurality of lower power supply lines extending in one direction so as to be electrically connected to some circuit units from among the plurality of circuit units, the some circuit units being along the one direction, and a plurality of upper power supply lines extending in the one direction, the upper power supply lines being over the plurality of lower power supply lines, and electrically connected to the plurality of lower power supply lines.

18 Claims, 11 Drawing Sheets

(56) References Cited

U.S. PATENT DOCUMENTS

| | | | |
|---|---|---|---|
| 2003/0137255 A1* | 7/2003 | Park | G09G 3/3233 315/169.3 |
| 2005/0243031 A1* | 11/2005 | Fish | G09G 3/3233 345/76 |
| 2008/0074412 A1* | 3/2008 | Nozawa | G09G 3/3233 345/212 |
| 2012/0169704 A1* | 7/2012 | Chung | G09G 3/3233 345/212 |
| 2015/0214359 A1 | 7/2015 | Toda et al. | |

* cited by examiner

DISPLAY APPARATUS

CROSS-REFERENCE TO RELATED APPLICATION

Korean Patent Application No. 10-2016-0052324, filed on Apr. 28, 2016, in the Korean Intellectual Property Office, and entitled: "Display Apparatus," is incorporated by reference herein in its entirety.

BACKGROUND

1. Field

Embodiments relate to a display apparatus.

2. Description of the Related Art

In general, a display apparatus includes a display device and circuit units for controlling an electric signal applied to the display device. Each of the circuit units includes a thin-film transistor (TFT), a capacitor, or the like.

Power to operate the circuit units or the display device, or electric signals to control emission or luminance of the display device may be applied to the circuit units via various wires.

SUMMARY

Embodiments are directed to a display apparatus including a plurality of pixel electrodes, a plurality of circuit units in one-to-one correspondence with the plurality of pixel electrodes, respectively, each of the plurality of circuit units being electrically connected to a corresponding one of the plurality of pixel electrodes, a plurality of lower power supply lines extending in one direction so as to be electrically connected to some circuit units from among the plurality of circuit units, the some circuit units being along the one direction, and a plurality of upper power supply lines extending in the one direction, the upper power supply lines being over the plurality of lower power supply lines, and electrically connected to the plurality of lower power supply lines.

The plurality of upper power supply lines may be in one-to-one correspondence with the plurality of lower power supply lines. Each of the plurality of circuit units may be electrically connected to a corresponding one of the plurality of lower power supply lines.

The plurality of upper power supply lines are electrically connected to each other by branch lines that extend in another direction crossing the one direction.

Each of the plurality of circuit units may include a first conductive layer and a second conductive layer, the second conductive layer being over the first conductive layer. Each of the plurality of lower power supply lines may be on a same layer as the first conductive layer. Each of the plurality of upper power supply lines may be on a same layer as the second conductive layer.

Each of the plurality of lower power supply lines may include a same material as that of the first conductive layer. Each of the plurality of upper power supply lines may include a same material as that of the second conductive layer.

The first conductive layer may have a layered structure. Each of the plurality of lower power supply lines may have a same layered structure as the first conductive layer. The second conductive layer may have a layered structure. Each of the plurality of upper power supply lines may have a same layered structure as the second conductive layer.

The display apparatus may further include an insulating layer between the first conductive layer and the second conductive layer and between the plurality of lower power supply lines and the plurality of upper power supply lines. The insulating layer may include an opening to expose at least a portion of a top surface of the plurality of lower power supply lines. The plurality of lower power supply lines may contact the plurality of upper power supply lines via the opening.

The insulating layer may be an inorganic layer.

One of the plurality of lower power supply lines may be electrically connected to corresponding one of the plurality of upper power supply lines at a plurality of locations.

The plurality of lower power supply lines and the plurality of upper power supply lines may be electrically connected to each other at locations corresponding to the plurality of pixel electrodes.

The plurality of lower power supply lines and the plurality of upper power supply lines may be electrically connected to each other at locations corresponding to some pixel electrodes from among the plurality of pixel electrodes.

The plurality of pixel electrodes may be located in a display area of the display apparatus. The plurality of lower power supply lines and the plurality of upper power supply lines may be electrically connected to each other at points that are randomly located in the display area.

Each of the plurality of circuit units may include a plurality of thin film transistors (TFTs) including a driving TFT, a switching TFT, a compensation TFT, an initialization TFT, a driving control TFT, an emission control TFT, and a bypass TFT.

The compensation TFT of one circuit unit of the plurality of circuit units may include a compensation channel region located next to a boundary of the one circuit unit and an adjacent circuit unit. A data line of the adjacent circuit unit may be located in the adjacent circuit unit next to the boundary of the one circuit unit and the adjacent circuit unit. A shield layer may extend across the boundary of the one circuit unit and the adjacent circuit unit. The shield layer may prevent parasitic capacitance from being generated between the compensation channel region of the one circuit unit and the data line of the adjacent circuit unit.

The shield layer may be electrically connected to a lower power supply line of the plurality of lower power supply lines and may be insulated from the compensation channel region of the one circuit unit and from the data line of the adjacent circuit unit.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
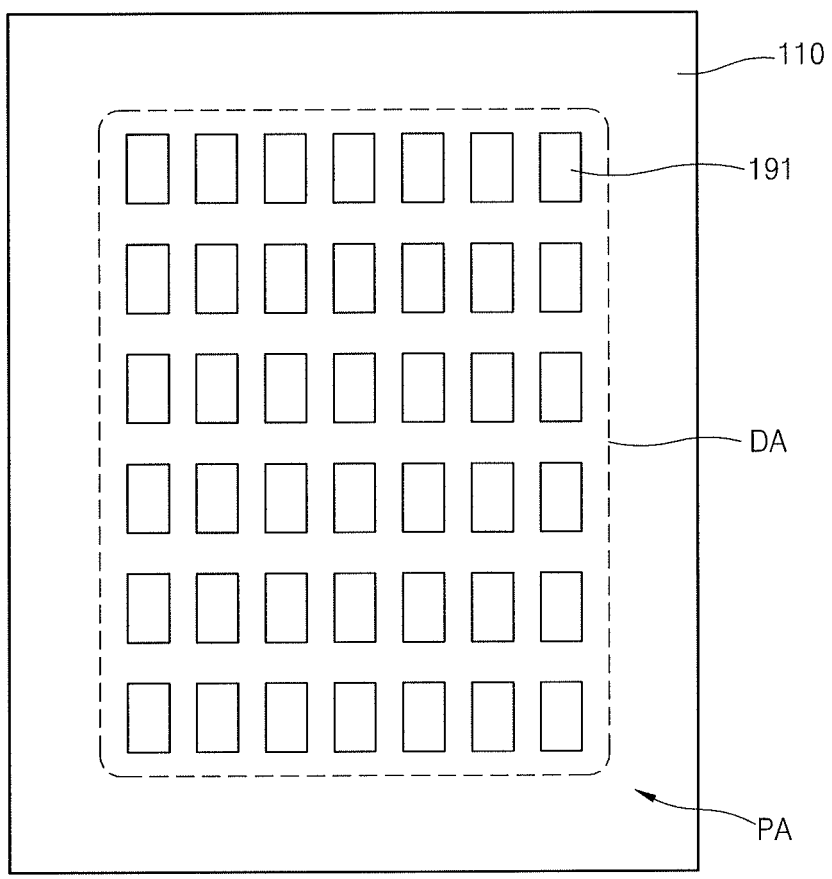
FIG. 1 illustrates a plan view depicting a portion of a display apparatus, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, in one or more embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a plan view of a portion of a display apparatus, according to an embodiment. As illustrated in FIG. 1, the display apparatus according to the present embodiment includes a substrate 110. The substrate 110 included in the display apparatus (hereinafter, the display apparatus may also be referred to as the organic light-emitting display apparatus) according to the present embodiment as illustrated in FIG. 1 has a display area DA and a peripheral area PA outside the display area DA. Various display devices such as organic light-emitting devices may be in the display area DA of the substrate 110. Various wires for delivering an electric signal to be applied to the display area DA may be in the peripheral area PA of the substrate 110. FIG. 1 illustrates that the display apparatus includes an organic light-emitting device as the display device. In other implementations, other devices that display an image may be used as the display device. FIG. 1 illustrates a plurality of pixel electrodes 191 in the display area DA. The plurality of pixel electrodes 191 may correspond to the display devices.

Figure 2:
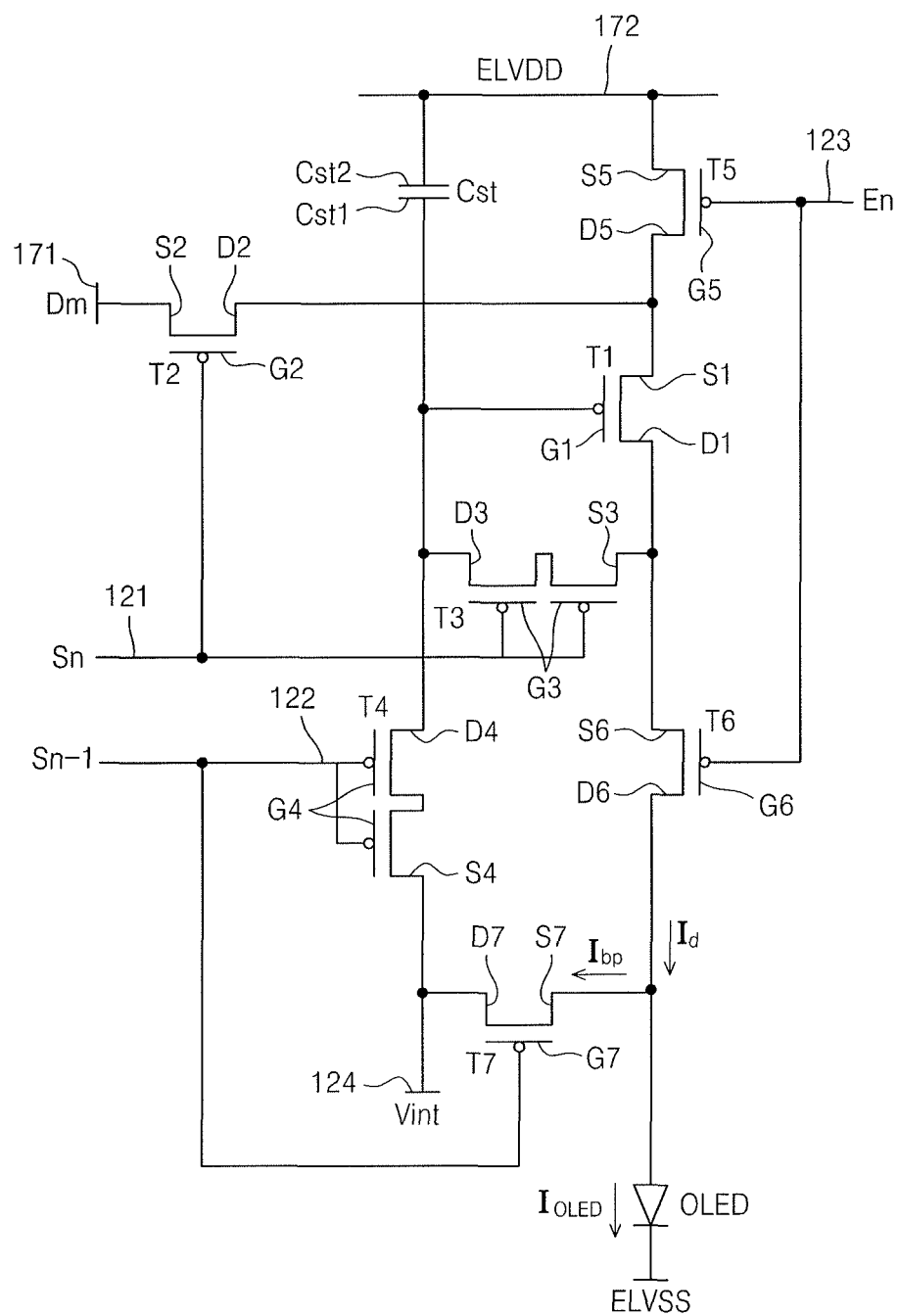
FIG. 2 illustrates an equivalent circuit diagram depicting one (sub)pixel in the display apparatus of FIG. 1.

FIG. 2 illustrates an equivalent circuit diagram of one (sub)pixel in the display area DA of the display apparatus of FIG. 1. FIG. 2 illustrates a case in which the (sub)pixel includes an organic light-emitting device OLED. It is to be understood that the display apparatus according to the present embodiment may include a plurality of circuit units that respectively correspond to the plurality of pixel electrodes 191 and are electrically connected to the plurality of pixel electrodes 191. For example, FIG. 2 is the equivalent circuit diagram illustrating one circuit unit from among the plurality of circuit units.

As illustrated in FIG. 2, one (sub)pixel of the display apparatus according to the present embodiment may include a plurality of thin-film transistors (TFTs) T1, T2, T3, T4, T5, T6, and T7; a storage capacitor Cst; and the organic light-emitting device OLED. The TFTs T1, T2, T3, T4, T5, T6, and T7 or the storage capacitor Cst may be elements included in the circuit unit. The circuit unit is electrically connected to a plurality of signal lines 121, 122, 123, 124, and 171, and power supply lines 172 and 178. The signal lines 121, 122, 123, 124, and 171 or the power supply lines 172 and 178 may be electrically connected to a plurality of (sub)pixels.

The TFTs T1, T2, T3, T4, T5, T6, and T7 may include a driving TFT T1, a switching TFT T2, a compensation TFT T3, an initialization TFT T4, a driving control TFT T5, an emission control TFT T6, and a bypass TFT T7.

The signal lines 121, 122, 123, 124, and 171 may include a scan line 121 to deliver a scan signal Sn; a previous scan line 122 to deliver a previous scan signal Sn-1 to the initialization TFT T4 and the bypass TFT T7; an emission control signal line 123 to deliver an emission control signal En to the driving control TFT T5 and the emission control TFT T6; a data line 171 to cross the scan line 121 and to deliver a data signal Dm; an the initialization voltage line 124 to deliver an initialization voltage Vint for initializing the driving TFT T1. In addition, a lower power supply line 172 that delivers a driving voltage ELVDD and is almost parallel to the data line 171, and an upper power supply line 178 located thereon (see FIG. 8) are included along with the signal lines.

A gate electrode G1 of the driving TFT T1 may be connected to a first storage capacitor plate Cst1 of the storage capacitor Cst. A source electrode S1 of the driving TFT T1 may be connected to the lower power supply line 172 via the driving control TFT T5. A drain electrode D1 of the driving TFT T1 may be electrically connected to a pixel electrode 191 (refer to FIG. 9) of the organic light-emitting device OLED via the emission control TFT T6. The driving TFT T1 may receive the data signal Dm according to a switching operation by the switching TFT T2 and thus may supply driving current $I_{OLED}$ to the organic light-emitting device OLED.

A gate electrode G2 of the switching TFT T2 may be connected to the scan line 121. A source electrode S2 of the switching TFT T2 may be connected to the data line 171. A drain electrode D2 of the switching TFT T2 may be connected to the source electrode S1 of the driving TFT T1 and may be connected to the lower power supply line 172 via the driving control TFT T5. The switching TFT T2 may be turned on according to the scan signal Sn received via the scan line 121 and may performs a switching operation to deliver the data signal Dm delivered via the data line 171 to the source electrode S1 of the driving TFT T1.

A gate electrode G3 of the compensation TFT T3 may be connected to the scan line 121. A source electrode S3 of the compensation TFT T3 may be connected to the drain electrode D1 of the driving TFT T1 and may be connected to the pixel electrode 191 (refer to FIG. 9) of the organic light-emitting device OLED via the emission control TFT T6. A drain electrode D3 of the compensation TFT T3 may be connected to the first storage capacitor plate Cst1 of the storage capacitor Cst, a drain electrode D4 of the initialization TFT T4, and the gate electrode G1 of the driving TFT T1. The compensation TFT T3 may be turned on according to the scan signal Sn received via the scan line 121 and may diode-connect the driving TFT T1 by electrically connecting the gate electrode G1 and the drain electrode D1 of the driving TFT T1.

A gate electrode G4 of the initialization TFT T4 may be connected to the previous scan line 122. A source electrode S4 of the initialization TFT T4 may be connected to a drain electrode D7 of the bypass TFT T7 and the initialization voltage line 124. The drain electrode D4 of the initialization TFT T4 may be connected to the first storage capacitor plate Cst1 of the storage capacitor Cst, the drain electrode D3 of the compensation TFT T3, and the gate electrode G1 of the driving TFT T1. The initialization TFT T4 may be turned on according to the previous scan signal Sn-1 received via the previous scan line 122 and may deliver the initialization voltage Vint to the gate electrode G1 of the driving TFT T1 so as to perform an initialization operation for initializing a voltage of the gate electrode G1 of the driving TFT T1.

A gate electrode G5 of the driving control TFT T5 may be connected to the emission control signal line 123. A source electrode S5 of the driving control TFT T5 may be connected to the lower power supply line 172. A drain electrode D5 of the driving control TFT T5 may be connected to the source electrode S1 of the driving TFT T1 and the drain electrode D2 of the switching TFT T2.

A gate electrode G6 of the emission control TFT T6 may be connected to the emission control signal line 123. A source electrode S6 of the emission control TFT T6 may be connected to the drain electrode D1 of the driving TFT T1 and the source electrode S3 of the compensation TFT T3. A drain electrode D6 of the emission control TFT T6 may be electrically connected to a source electrode S7 of the bypass TFT T7 and the pixel electrode 191 of the organic light-emitting device OLED. The driving control TFT T5 and the emission control TFT T6 may be simultaneously turned on according to the emission control signal En received via the emission control signal line 123 so as to allow the driving current $I_{OLED}$ to flow to the organic light-emitting device OLED by applying the driving voltage ELVDD to the organic light-emitting device OLED.

A gate electrode G7 of the bypass TFT T7 may be connected to the previous scan line 122. A source electrode S7 of the bypass TFT T7 may be connected to the drain electrode D6 of the emission control TFT T6 and the pixel electrode 191 (refer to FIG. 9) of the organic light-emitting device OLED. A drain electrode D7 of the bypass TFT T7 may be connected to the source electrode S4 of the initialization TFT T4 and the initialization voltage line 124. The bypass TFT T7 may receive the previous scan signal Sn-1 delivered via the previous scan line 122, via the gate electrode G7. When an electric signal having a predetermined voltage capable of turning off the bypass TFT T7 is applied from the previous scan signal Sn-1, the bypass TFT T7 may be turned off and a portion of driving current $I_d$ may flow as a bypass current $I_{bp}$ via the bypass TFT T7.

When minimum current of the driving TFT T1 flows as driving current for displaying a black image, if the organic light-emitting device OLED were to emit light, the black image would not be appropriately displayed. Here, the minimum current of the driving TFT T1 indicates current under a condition in which a gate-source voltage $V_{GS}$ of the driving TFT T1 is less than a threshold voltage $V_{th}$, such that the driving TFT T1 is turned off. Therefore, in order to prevent emission of the organic light-emitting device OLED when the minimum current flows as the driving current, the bypass TFT T7 may distribute, as the bypass current $I_{bp}$, the portion of the driving current $I_d$, which flows out of the driving TFT T1, to a current path other than a current path toward the organic light-emitting device OLED. In this manner, current smaller than minimum driving current (e.g., current equal to or less than 10 pA) under a condition of turning off the driving TFT T1 is delivered to the organic light-emitting device OLED, such that the organic light-emitting device OLED does not emit light or hardly emits light, and a black image is displayed.

When the minimum driving current to display the black image flows, emission or non-emission or a level of the emission of the organic light-emitting device OLED may be significantly affected, since the bypass current $I_{bp}$ is diverged from the minimum driving current. However, when a large driving current to display a general image or a white image flows, the level of the emission of the organic light-emitting device OLED is hardly affected by the bypass current $I_{bp}$. Therefore, the driving current $I_{OLED}$ of the organic light-emitting device OLED, which is decreased by the bypass current $I_{bp}$ that is diverged from the driving current $I_d$ via the bypass TFT T7 when the driving current to display the black image flows, may have a level capable of clearly expressing the black image. Thus, by realizing a clear black luminance image by using the bypass TFT T7, a contrast ratio may be improved.

As shown in FIG. 2, the initialization TFT T4 and the bypass TFT T7 may be connected to the previous scan line 122. In some implementations, the initialization TFT T4 may be connected to the previous scan line 122 and may be driven according to the previous scan signal Sn-1, and the bypass TFT T7 may be connected to a separate wire and may be driven according to a signal delivered via the wire.

A second storage capacitor plate Cst2 of the storage capacitor Cst may be connected to the lower power supply line 172, and an opposite electrode of the organic light-emitting device OLED may be connected to a common electrode ELVSS. Accordingly, the organic light-emitting device OLED may emit light by receiving the driving current $I_{OLED}$ from the driving TFT T1 and thus may display an image.

Referring to FIG. 2, each of the compensation TFT T3 and the initialization TFT T4 may have dual gate electrodes. In some implementations, each of the compensation TFT T3 and the initialization TFT T4 may have one gate electrode. In some implementations, at least one of other TFTs T1, T2, T5, T6, and T7 other than the compensation TFT T3 and the initialization TFT T4 may have two gate electrodes.

Hereinafter, an operation of one pixel of the organic light-emitting display apparatus is described below.

First, during an initialization period, the previous scan signal Sn-1 having a low level may be supplied via the previous scan line 122. Then, the initialization TFT T4 may be turned on in response to the previous scan signal Sn-1 having the low level, and the initialization voltage Vint from the initialization voltage line 124 may be delivered to the gate electrode G1 of the driving TFT T1 via the initialization TFT T4 such that the driving TFT T1 is initialized due to the initialization voltage Vint.

Afterward, during a data programming period, a scan signal Sn having a low level may be supplied via the scan line 121. Then, in response to the scan signal Sn having the low level, the switching TFT T2 and the compensation TFT T3 may be turned on. Accordingly, the driving TFT T1 may be diode-connected by the turned on compensation TFT T3, and may be biased in a forward direction. Then, a compensation voltage Dm+Vth (where Vth is a negative value) obtained by subtracting a threshold voltage Vth of the driving TFT T1 from the data signal Dm that is supplied via the data line 171 may be applied to the gate electrode G1 of the driving TFT T1. Then, the driving voltage ELVDD and the compensation voltage Dm+Vth may be applied to both terminals of the storage capacitor Cst, such that charges corresponding to a voltage difference between both terminals are stored in the storage capacitor Cst.

Afterward, during an emission period, an emission control signal En supplied from the emission control signal line 123 may be changed from a high level to a low level. Then, during the emission period, the driving control TFT T5 and the emission control TFT T6 may be turned on in response to the emission control signal En having the low level. Then, the driving current $I_{OLED}$, which is determined according to a difference between a voltage of the gate electrode G1 of the driving TFT T1 and a voltage of the driving voltage ELVDD, may be generated. Then, the driving current $I_{OLED}$ may be supplied to the organic light-emitting device OLED via the emission control TFT T6. During the emission period, a gate-source voltage $V_{GS}$ of the driving TFT T1 may be maintained at '(Dm+Vth)-ELVDD' due to the storage capacitor Cst. According to a current-voltage relation of the driving TFT T1, the driving current $I_{OLED}$ may be proportional to '(Dm−ELVDD)$^2$' which is a square of a value obtained by subtracting the threshold voltage Vth from the gate-source voltage $V_{GS}$. Thus, the driving current $I_{OLED}$ may be determined regardless of the threshold voltage Vth of the driving TFT T1.

Hereinafter, a detailed structure of one (sub)pixel of the organic light-emitting display apparatus illustrated in FIG. 2 is described with reference to FIGS. 3 through 10.

Figure 3:
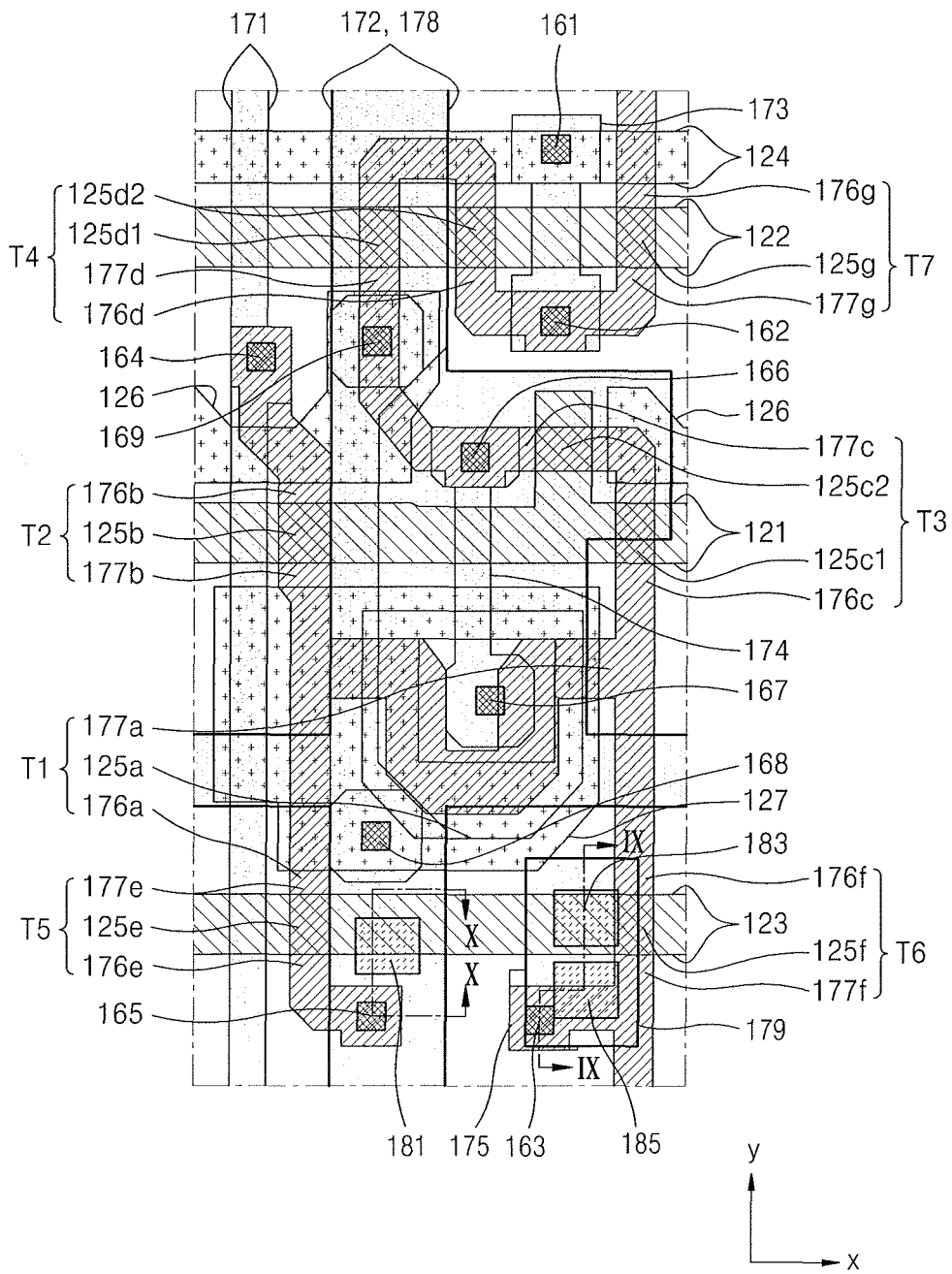
FIG. 3 illustrates a layout of locations of a plurality of thin-film transistors (TFTs) and a capacitor in the (sub)pixel of FIG. 2.

FIG. 3 illustrates a distribution view showing locations of a plurality of TFTs and a capacitor in the (sub)pixel of FIG. 2. For reference, the distribution view as illustrated in FIG. 3 is a distribution view of one (sub)pixel. Additional (sub)pixels, each having an equal or similar configuration, may be distributed in up and down-right and left directions of the one (sub)pixel. FIGS. 4 through 8 are distribution views of layers each having elements such as the plurality of TFTs, the capacitor, or the like of FIG. 3. For example, each of FIGS. 4 through 8 illustrates wires of a same layer or an arrangement of a semiconductor layer. An insulating layer or the like may be interposed between layered structures illustrated in FIGS. 4 through 8. For example, a first gate insulating layer 141 (refer to FIG. 9) may be interposed between a layer of FIG. 4 and a layer of FIG. 5, a second gate insulating layer 142 (refer to FIG. 9) may be interposed between the layer of FIG. 5 and a layer of FIG. 6, and a first inorganic layer 151 (refer to FIG. 9) may be interposed between a layer of FIG. 7 and a layer of FIG. 8. Contact holes may be formed in the aforementioned insulating layers, such that the layered structures illustrated in FIGS. 4 through 8 may be electrically connected to each other in a vertical direction. In this manner, the display apparatus according to the present embodiment may have a circuit unit that is located in the display area DA and includes conductive layers.

The organic light-emitting display apparatus according to the present embodiment may include the scan line 121, the previous scan line 122, the emission control signal line 123, and the initialization voltage line 124, which are provided along a row direction and respectively apply the scan signal Sn, the previous scan signal Sn-1, the emission control signal En, and the initialization voltage Vint to the (sub)pixel. The display apparatus according to the present embodiment may include the data line 171, and the power supply lines 172 and 178, which cross the scan line 121, the previous scan line 122, the emission control signal line 123, and the initialization voltage line 124 and respectively apply the data signal Dm and the driving voltage ELVDD to the (sub)pixel. The (sub)pixel may include the organic light-emitting device OLED and a circuit unit electrically connected to the organic light-emitting device OLED. In this regard, the organic light-emitting device OLED may include the pixel electrode 191, and the circuit unit may include the driving TFT T1, the switching TFT T2, the compensation TFT T3, the initialization TFT T4, the driving control TFT T5, the emission control TFT T6, the bypass TFT T7, and the storage capacitor Cst.

The scan line 121, the previous scan line 122, the emission control signal line 123, and the initialization voltage line 124 may be commonly and electrically connected to circuit units of (sub)pixels which are arrayed along an X-axis. Another scan line 121, another previous scan line 122, another emission control signal line 123, and another initialization voltage line 124 that extend in a direction of the X-axis may be located in (sub)pixels in +y and −y directions from FIG. 3. The data line 171 and the power supply lines 172 and 178 may be commonly and electrically connected to the circuit units of the (sub)pixels that are arrayed along an Y-axis. In addition, another data line 171 and other power supply lines 172 and 178 that extend in a direction of the Y-axis may be located in (sub)pixels in +x and −x directions from FIG. 3. For example, the display apparatus according to the present embodiment may include the plurality of scan lines 121, the plurality of previous scan lines 122, the plurality of emission control signals 123, the plurality of initialization voltage lines 124, the plurality of data lines 171, and the plurality of power supply lines 172 and 178.

Figure 4:
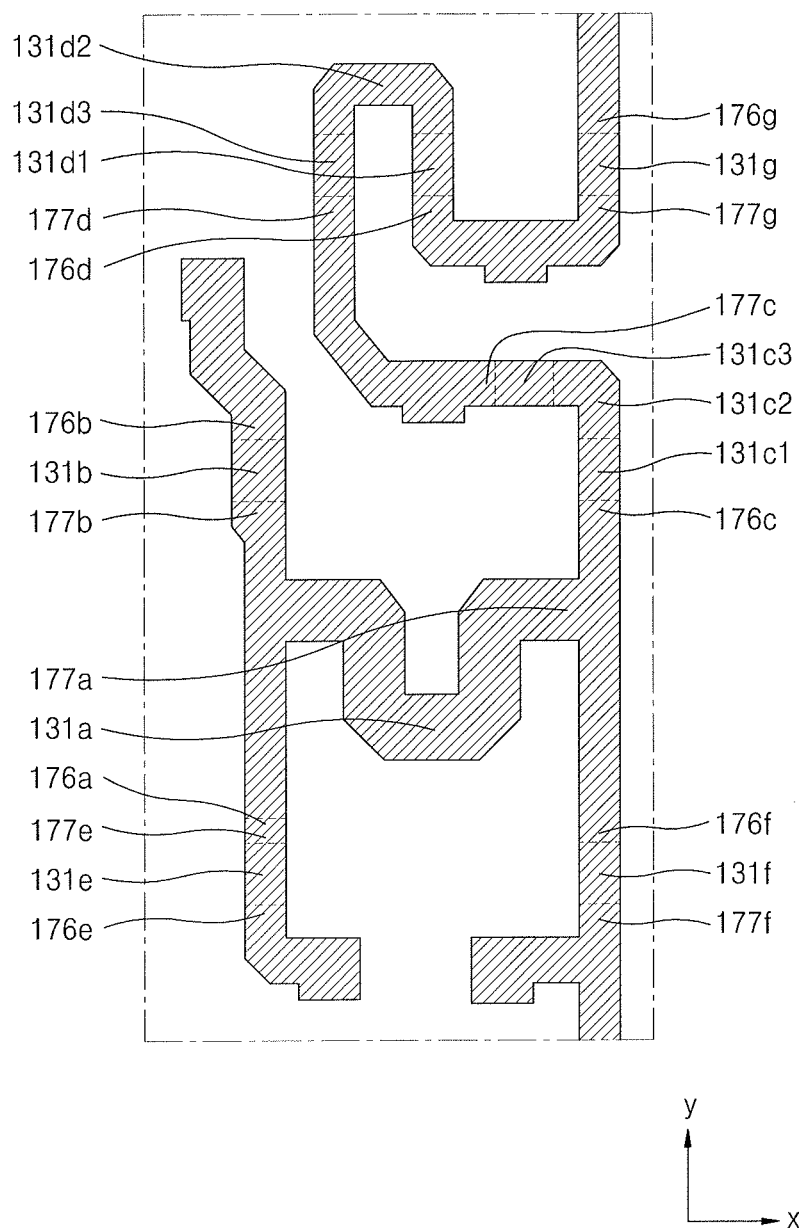
FIGS. 4 through 8 illustrate layouts of layers each having elements such as the plurality of TFTs, the capacitor, and the like of FIG. 3.

The driving TFT T1, the switching TFT T2, the compensation TFT T3, the initialization TFT T4, the driving control TFT T5, the emission control TFT T6, and the bypass TFT T7 may be formed along a semiconductor layer as illustrated in FIG. 4. The semiconductor layer may have a shape that is curved in various directions. The semiconductor layer may include a driving channel region 131a corresponding to the driving TFT T1, a switching channel region 131b corresponding to the switching TFT T2, compensation channel regions 131c1, 131c2, and 131c3 corresponding to the compensation TFT T3, initialization channel regions 131d1, 131d2, and 131d3 corresponding to the initialization TFT T4, an operation control channel region 131e corresponding to the driving control TFT T5, an emission control channel region 131f corresponding to the emission control TFT T6, and a bypass channel region 131g corresponding to the bypass TFT T7. For example, the driving channel region 131a, the switching channel region 131b, the compensation channel regions 131c1, 131c2, and 131c3, the initialization channel regions 131d1, 131d2, and 131d3, the operation control channel region 131e, the emission control channel region 131f, and the bypass channel region 131g may be particular regions of the semiconductor layer as illustrated in FIG. 4.

The semiconductor layer may include polysilicon. The semiconductor layer may include the aforementioned channel regions, which are not doped with an impurity, and source and drain regions that are at both sides of the channel regions and are doped with an impurity. Here, the impurity may vary according to types of a TFT and may include an N-type impurity or a P-type impurity. The channel region, the source region at one side of the channel region, and the drain region at the other side of the channel region may be referred to as an active layer. For example, the TFT may have the active layer that includes the channel region, the source region, and the drain region.

The doped source region or the doped drain region may be a source electrode or drain electrode of the TFT. For example, a driving source electrode may correspond to a driving source region 176a doped with an impurity in a periphery of a driving channel region 131a of the semiconductor layer as illustrated in FIG. 4. A driving drain electrode may correspond to a driving drain region 177a doped with an impurity in a periphery of the driving channel region 131a of the semiconductor layer as illustrated in FIG. 4. Hereinafter, for convenience of description, terms such as a source region and a drain region are used instead of a source electrode and a drain electrode. In addition, portions of the semiconductor layer as illustrated in FIG. 4 between the TFTs may be interpreted as wires that are doped with an impurity, and thus may function to electrically connect the TFTs. This characteristic may also be applied to embodiments and modified embodiments thereof to be described below.

The storage capacitor Cst may include a first storage capacitor plate 125a and a second storage capacitor plate 127, which have the second gate insulating layer 142 interposed therebetween. Here, the first storage capacitor plate 125a may also function as a driving gate electrode 125a of the driving TFT T1. For example, the driving gate electrode 125a and the first storage capacitor plate 125a may be one body. Hereinafter, for convenience of description, when a driving gate electrode is mentioned, a reference numeral of the driving gate electrode is the same as that of the first storage capacitor plate 125a.

Figure 5:
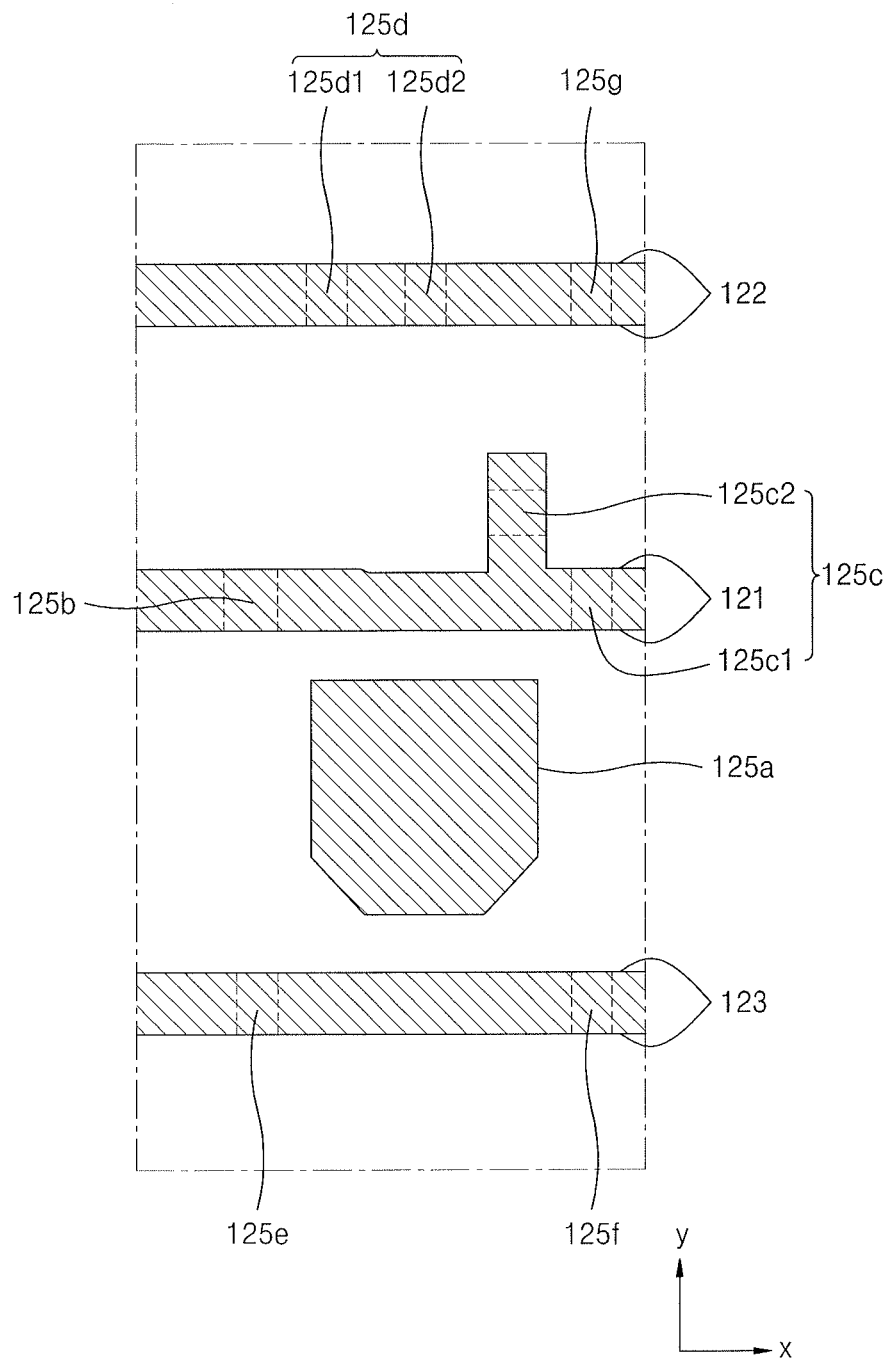

As illustrated in FIG. 5, the first storage capacitor plate 125a may have an island form that is spaced apart from an adjacent (sub)pixel. As illustrated in FIG. 5, the first storage capacitor plate 125a may be formed from the same material layer as the scan line 121, the previous scan line 122, and the emission control signal line 123.

A switching gate electrode 125b and compensation gate electrodes 125c1 and 125c2 may constitute portions of the scan line 121 or may be protrusions from the scan line 121 that cross the semiconductor layer. Initialization gate electrodes 125d1 and 125d2 and a bypass gate electrode 125g may constitute portions of the previous scan line 122 or may be protrusions from the scan line 121 that cross the semiconductor layer. An operation control gate electrode 125e and an emission control gate electrode 125f may constitute portions of the emission control signal line 123 or may be protrusions from the scan line 121 that crosses the semiconductor layer.

Figure 6:
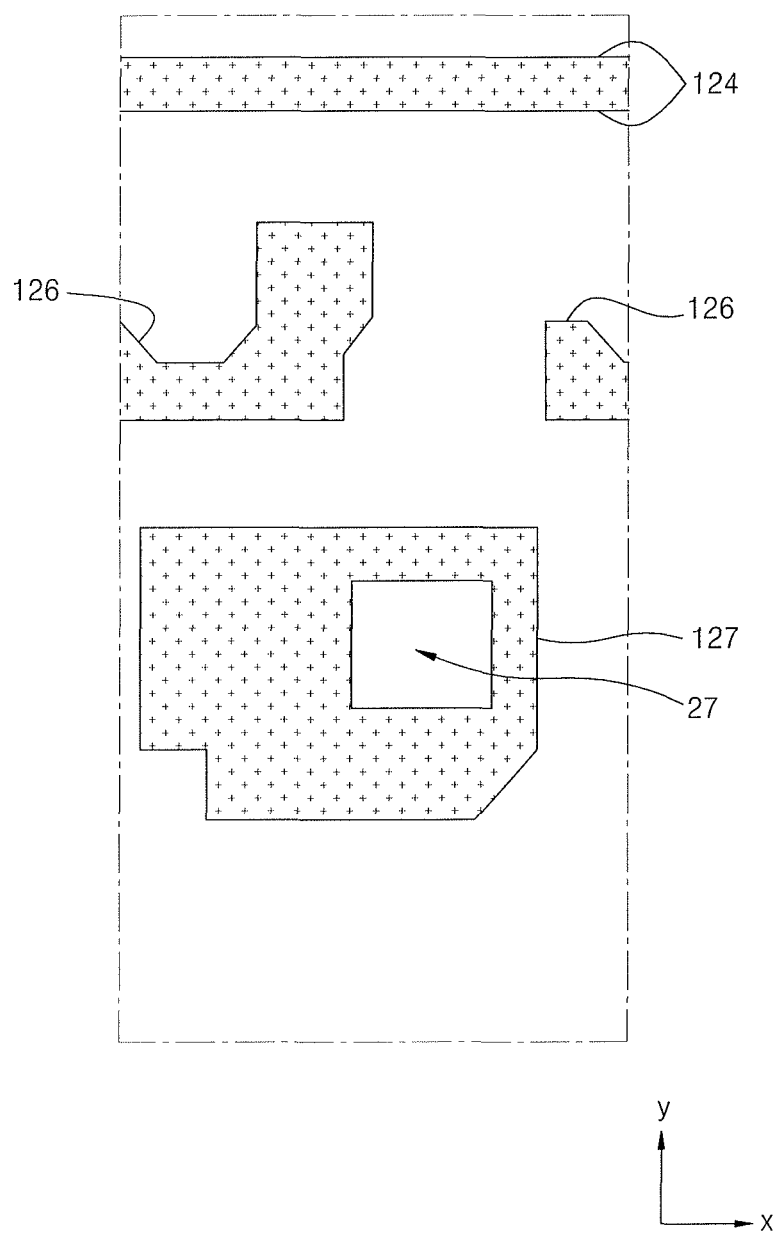

The second storage capacitor plate 127 may extend over adjacent (sub)pixels. As illustrated in FIG. 6, the second storage capacitor plate 127 may be formed from the same material layer as the initialization voltage line 124 and/or a shield layer 126. A storage opening 27 may be formed in the second storage capacitor plate 127. The first storage capacitor plate 125a and a compensation drain region 177c of the compensation TFT T3 may be electrically connected to each other by using a connection member 174 to be described below, via the storage opening 27. The second storage capacitor plate 127 may be connected to the lower power supply line 172 via a contact hole 168 formed in an interlayer insulating layer 143 (refer to FIG. 9).

The driving TFT T1 includes the driving channel region 131a, the driving gate electrode 125a, the driving source region 176a, and the driving drain region 177a. As described above, the driving gate electrode 125a may also function as the first storage capacitor plate 125a. The driving source region 176a indicates a portion of the semiconductor layer in a periphery of the driving channel region 131a (in a −x direction in FIG. 4), and the driving drain region 177a indicates a portion of the semiconductor layer in a periphery of the driving channel region 131a (in a +x direction in FIG. 4). The driving drain region 177a is at an opposite side from the driving source region 176a with the driving gate electrode 125a located therebetween.

The driving source region 176a of the driving TFT T1 is connected to a switching drain region 177b and an operation control drain region 177e to be described below. The driving drain region 177a is connected to a compensation source region 176c and an emission control source region 176f to be described below.

The switching TFT T2 includes the switching channel region 131b, the switching gate electrode 125b, a switching source region 176b, and the switching drain region 177b. The switching source region 176b may be electrically connected to the data line 171 via a contact hole 164 formed in the first gate insulating layer 141, the second gate insulating layer 142, and the interlayer insulating layer 143. If desired, a periphery of the contact hole 164 of the data line 171 may be a source region of the switching TFT T2. The switching drain region 177b indicates a portion of the semiconductor layer that is doped with an impurity. The switching drain region 177b is at an opposite side of the switching source region 176b, with the switching channel region 131b located therebetween.

The switching TFT T2 is used as a switching device configured to select an emission target (sub)pixel. The switching gate electrode 125b is connected to the scan line 121, the switching source region 176b is connected to the data line 171 as described above, and the switching drain region 177b is connected to the driving TFT T1 and the driving control TFT T5.

The compensation TFT T3 includes the compensation channel regions 131c1, 131c2, and 131c3, the compensation gate electrodes 125c and 125c2, the compensation source region 176c, and the compensation drain region 177c. The compensation source region 176c is a portion of the semiconductor layer that is doped with an impurity and in a periphery of the compensation channel regions 131c1, 131c2, and 131c3 The compensation drain region 177c in a periphery of the compensation channel regions 131c1, 131c2, and 131c3 is doped with an impurity. The compensation gate electrodes 125c1 and 125c2 are dual gate electrodes including the first gate electrode 125c1 and the second gate electrode 125c2, which may be arranged to prevent or decrease an occurrence of leakage current. The compensation drain region 177c of the compensation TFT T3 may be connected to the first storage capacitor plate 125a via the connection member 174. The compensation channel regions 131c1, 131c2, and 131c3 may include the portion 131c1 corresponding to the first gate electrode 125c1, the portion 131c3 corresponding to the second gate electrode 125c2, and the portion 131c2 between the portions 131c1 and 131c3.

Figure 7:
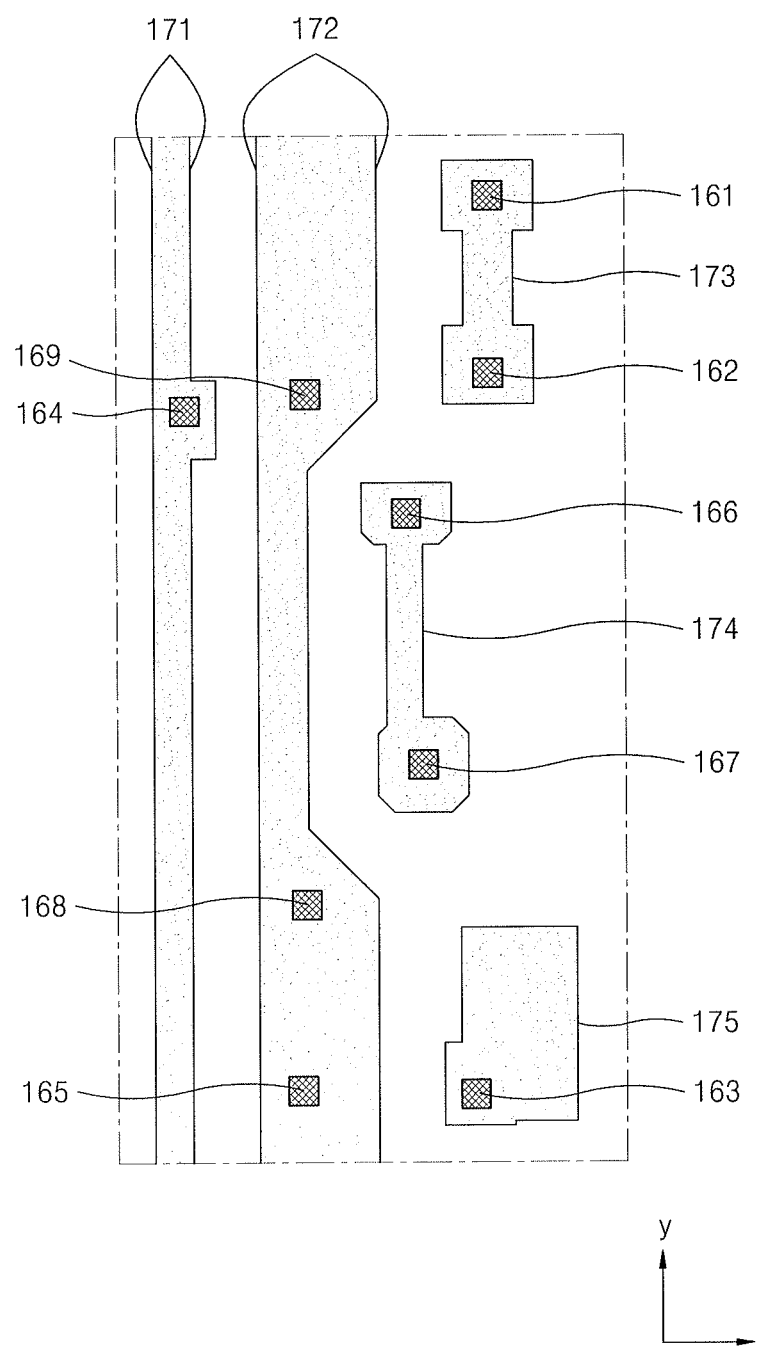

The connection member 174 may be formed from the same material layer as the data line 171 as illustrated in FIG. 7. An end of the connection member 174 may be connected to the compensation drain region 177c and an initialization drain region 177d via a contact hole 166 formed in the first gate insulating layer 141, the second gate insulating layer 142, and the interlayer insulating layer 143. The other end of the connection member 174 may be connected to the first storage capacitor plate 125a via a contact hole 167 formed in the second gate insulating layer 142 and the interlayer insulating layer 143. In this regard, the other end of the connection member 174 may be connected to the first storage capacitor plate 125a via the storage opening 27 formed in the second storage capacitor plate 127.

The initialization TFT T4 may include an initialization channel regions 131d1, 131d2, and 131d3, an initialization gate electrodes 125d1 and 125d2, an initialization source electrode 176d, and the initialization drain region 177d. The initialization source electrode 176d may be connected to the initialization voltage line 124 via an initialization connection line 173. An end of the initialization connection line 173 may be connected to the initialization voltage line 124 via a contact hole 161 formed in the second gate insulating layer 142 and the interlayer insulating layer 143. The other end of the initialization connection line 173 may be connected to the initialization source electrode 176d via a contact hole 162 formed in the first gate insulating layer 141, the second gate insulating layer 142, and the interlayer insulating layer 143. The initialization drain region 177d indicates a portion of the semiconductor layer that is doped with an impurity. The initialization drain region 177d may be at an opposite side from the initialization source electrode 176d with the initialization channel regions 131d1, 131d2, and 131d3 located therebetween.

The driving control TFT T5 may include the operation control channel region 131e, the operation control gate electrode 125e, an operation control source region 176e, and the operation control drain region 177e. The operation control source region 176e may be electrically connected to the lower power supply line 172 via a contact hole 165 formed in the first gate insulating layer 141, the second gate insulating layer 142, and the interlayer insulating layer 143. In some implementations, a periphery of the contact hole 165 of the lower power supply line 172 may be a source region of the driving control TFT T5. The operation control drain region 177e indicates a portion of the semiconductor layer that is doped with an impurity. The operation control drain region 177e may be at an opposite side from the operation control source region 176e, with the operation control channel region 131e located therebetween.

The emission control TFT T6 may include the emission control channel region 131f, the emission control gate electrode 125f, the emission control source region 176f, and an emission control drain region 177f. The emission control drain region 177f may be connected to a middle connection layer 175 over the interlayer insulating layer 143 via a contact hole 163 formed in the first gate insulating layer 141, the second gate insulating layer 142, and the interlayer insulating layer 143. As illustrated in FIG. 7, the middle connection layer 175, the data line 171, and the lower power supply line 172 may be located over the interlayer insulating layer 143. The emission control source region 176f indicates a portion of the semiconductor layer that is doped with an impurity. The emission control source region 176f is at an opposite side from the emission control drain region 177f, with the emission control channel region 131f located therebetween. The middle connection layer 175 may be electrically connected to an auxiliary connection layer 179 to be described below, and thus may be electrically connected to the pixel electrode 191 of the organic light-emitting device.

The bypass TFT T7 includes the bypass channel region 131g, the bypass gate electrode 125g, a bypass source region 176g, and a bypass drain region 177g. The bypass drain region 177g may be connected to the initialization source electrode 176d of the initialization TFT T4. Accordingly, the bypass drain region 177g may be connected to the initialization voltage line 124 via the initialization connection line 173. The bypass source region 176g may be electrically connected to a pixel electrode of an organic light-emitting device of a (sub)pixel (in a +y direction). For example, the bypass source region 176g may be connected to the emission control drain region 177f of the (sub)pixel (in the +y direction), such that the bypass source region 176g is connected to the middle connection layer 175 over the interlayer insulating layer 143 via the contact hole 163. As described above, the middle connection layer 175 may be electrically connected to the auxiliary connection layer 179, and thus may be electrically connected to the pixel electrode 191 of the organic light-emitting device.

As described above, the shield layer 126 may be formed from the same material layer as the second storage capacitor plate 127 and the initialization voltage line 124. As illustrated in FIG. 6, the shield layer 126 may be one body extending over a corresponding sub-pixel and an adjacent (sub)pixel (in a −x direction). The shield layer 126 in a right side of FIG. 6 may be one body extending over the corresponding sub-pixel and an adjacent (sub)pixel (in a +x direction). The shield layer 126 may overlap with at least the portion 131c2 between the portions 131c1 and 131c3 from among the compensation channel regions 131c1, 131c2, and 131c3. The shield layer 126 may be electrically connected to the lower power supply line 172 via a contact hole 169 formed in the interlayer insulating layer 143, and insulated from the compensation channel region of the circuit unit in which the shield layer 126 is located, and insulated from the data line of the adjacent circuit unit. Accordingly, an electric potential of the shield layer 126 may be approximately constant.

The data line 171 may also be present in a (sub)pixel adjacent (in a +x direction) to the (sub)pixel as illustrated in FIG. 3. For convenience of description, when the (sub)pixel as illustrated in FIG. 3 is referred to as a pixel P1, the (sub)pixel adjacent (in the +x direction) to the pixel P1 is referred to as a pixel P2. The data line 171 delivers a data signal not only to the pixel P2 but also to a plurality of (sub)pixels arranged in +y and −y directions of the pixel P2. In this regard, the delivered data signal may vary according to luminance to be realized in each of the plurality of (sub)pixels arranged in the +y and −y directions of the pixel P2. Accordingly, while the pixel P1 emits light, the data line 171 of the pixel P2 near the portion 131c2 of the semiconductor layer of the pixel P1 may deliver different electric signals according to flow of time.

If the shield layer 126 were not present, parasitic capacitance could be generated between the data line 171 of the pixel P2 and the portion 131c2 from among the compensation channel regions 131c1, 131c2, and 131c3 of the pixel P1. Thus, according to a flow of time during emission of the pixel P1, an electric potential of the portion 131c2 of the compensation TFT T3 of the pixel P1 could be affected by different electric signals delivered by the data line 171 of the pixel P2. The compensation TFT T3 is electrically connected to the driving TFT T1, thus, if the electric potential of the portion 131c2 of the compensation TFT T3 of the pixel P1 were to be affected by different electric signals delivered by the data line 171 of the pixel P2, luminance of the organic light-emitting device whose luminance is determined by the driving TFT T1 could become different from an original level, resulting in deterioration in quality of an image displayed by an organic light-emitting display apparatus.

However, in the organic light-emitting display apparatus according to the present embodiment, the shield layer 126 is present between the portion 131c2 of the compensation TFT T3 of the pixel P1 and the data line 171 of the pixel P2. Thus, the portion 131c2 of the compensation TFT T3 of the pixel P1 is not affected or is minimally affected by the data line 171 of the pixel P2 such that the high quality organic light-emitting display apparatus may display a high quality image with exact luminance.

For example, the shield layer 126 may be electrically connected to the lower power supply line 172 via the contact hole 169 formed in the interlayer insulating layer 143. Accordingly, the electric potential of the shield layer 126 may be approximately constant. As a result, the portion 131c2 of the compensation TFT T3 may be minimally affected by an electric signal around the portion 131c2.

The data line 171, the lower power supply line 172, the initialization connection line 173, the connection member 174, and the middle connection layer 175 may include a same material and, as illustrated in FIG. 7, may be on a same layer, for example, on the interlayer insulating layer 143. The lower power supply line 172 may supply a constant electric signal to a plurality of (sub)pixels. Thus, it is desirable to prevent an occurrence of a voltage drop in the lower power supply line 172 so as to provide a display apparatus that displays a high quality image. If a voltage drop were to occur in the lower power supply line 172, even if a data signal or the like is applied to a plurality of (sub)pixels so as to allow the plurality of (sub)pixels to emit light with uniform luminance, luminance of light emitted from the plurality of (sub)pixels could vary according to positions of the plurality of (sub)pixels, such that a quality of an image could deteriorate.

When the lower power supply line 172, the data line 171, the initialization connection line 173, the connection member 174, and the middle connection layer 175 are on the same layer, as illustrated in FIG. 7, there may be a limit to enlarging the area of the lower power supply line 172. As a result, it may not be easy to minimize the voltage drop at the lower power supply line 172.

Figure 8:
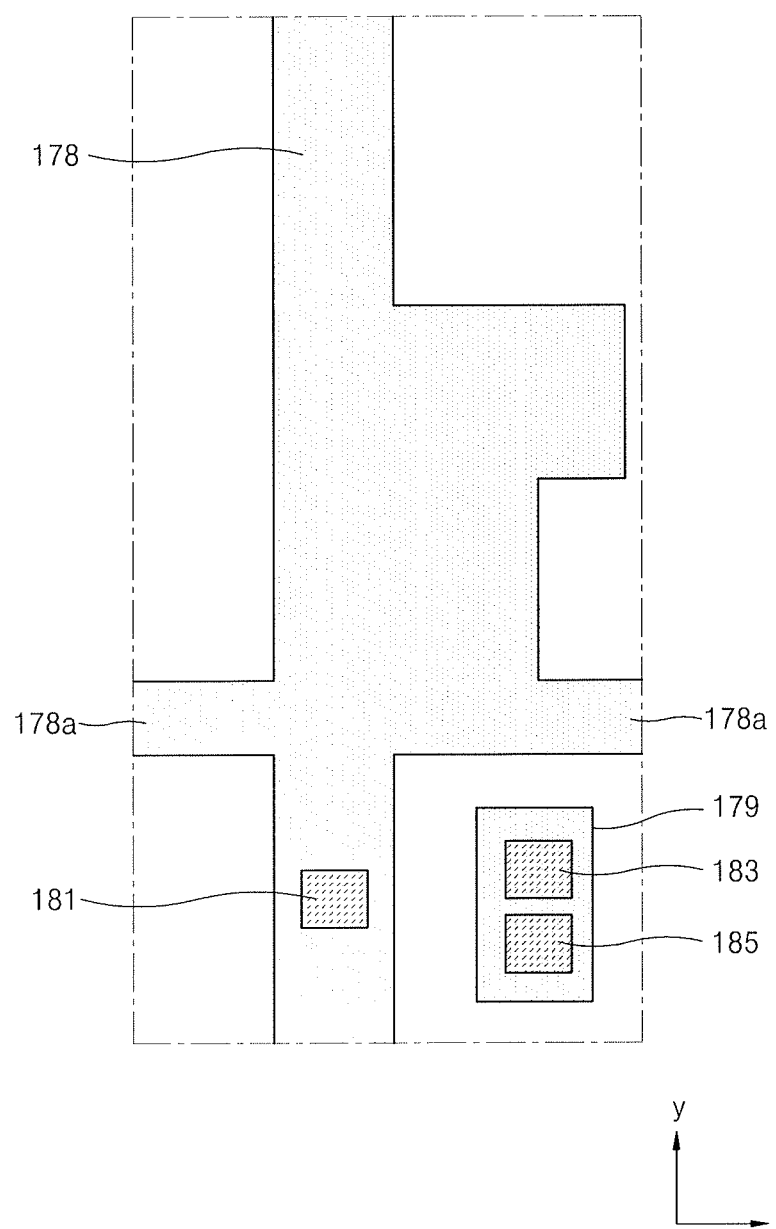

However, in the display apparatus according to the present embodiment, by placing the upper power supply line 178 as illustrated in FIG. 8 above the data line 171, the lower power supply line 172, the initialization connection line 173, the connection member 174, and the middle connection layer 175, and by electrically connecting the upper power supply line 178 to the lower power supply line 172 via a contact hole 181, an issue of voltage drop in the lower power supply line 172 may be addressed. The display apparatus may have branch lines 178a extending in an X-axis direction between the upper power supply lines 178 extending in a Y-axis direction as illustrated in FIG. 8, such that the upper power supply lines 178 extending in the Y-axis direction may be electrically connected to each other. As a result, as illustrated in FIG. 8, the upper power supply line 178 may have a "+" shape in a (sub)pixel, and, in an entire portion of the display area DA, the upper power supply line 178 may have a lattice shape. Based on this structure, a uniform electric signal may be applied to the circuit units via the lower power supply line 172 and/or upper power supply line 178 in an entire portion of the display area DA.

FIGS. 3 through 10 illustrate only one (sub)pixel, and as described above, the display apparatus according to the present embodiment may include a plurality of the lower power supply lines 172 and a plurality of the upper power supply lines 178. In this regard, the plurality of upper power supply lines 178 may correspond to the plurality of lower power supply lines 172, respectively, and may be electrically connected to the corresponding lower power supply lines 172.

The lower power supply lines 172 may be electrically connected to the corresponding upper power supply lines 178 at a plurality of positions. As illustrated in FIG. 8, in one (sub)pixel, the lower power supply line 172 may be electrically connected to the upper power supply line 178 via one contact hole 181. The lower power supply line 172 and the upper power supply line 178 that are shared among a plurality of (sub)pixels arrayed along a Y-axis may be electrically connected at a plurality of positions.

For example, if the lower power supply line 172 and the upper power supply line 178 are electrically connected to each other in each of the (sub)pixels as illustrated in FIG. 8, the plurality of lower power supply lines 172 may be electrically connected to the plurality of upper power supply lines 178, respectively, at points corresponding to a plurality of pixel electrodes 191. For example, the number of the contact holes 181 through which the plurality of lower power supply lines 172 are electrically connected to the plurality of upper power supply lines 178 may correspond to the number of the pixel electrodes 191.

In some (sub)pixels from among a plurality of (sub)pixels arrayed along the Y-axis, the lower power supply line 172 and the upper power supply line 178 may be directly connected to each other as illustrated in FIG. 8 and in some other (sub)pixels, the lower power supply line 172 and the upper power supply line 178 may not be directly connected to each other. For example, in an entire portion of the display area DA, the plurality of lower power supply lines 172 may be electrically connected to the plurality of upper power supply lines 178 at points corresponding to some pixel electrodes 191 from among the plurality of pixel electrodes 191. In addition, the plurality of lower power supply lines 172 may be electrically connected to the plurality of upper power supply lines 178 at a plurality of points that are randomly located in the display area DA.

As described above, the emission control drain region 177f is electrically connected to the pixel electrode 191 of the organic light-emitting device. The auxiliary connection layer 179 including a same material as the upper power supply line 178 may be located on a same layer as the upper power supply line 178, and may be electrically connected, via a contact hole 183, to the middle connection layer 175 that is electrically connected to the emission control drain region 177f via the contact hole 163. By electrically connecting the auxiliary connection layer 179 with the pixel electrode 191 of the organic light-emitting device via a contact hole 185 formed in an upper layer, the auxiliary connection layer 179 may allow the emission control drain region 177f to be electrically connected with the pixel electrode 191 of the organic light-emitting device.

Figure 9:
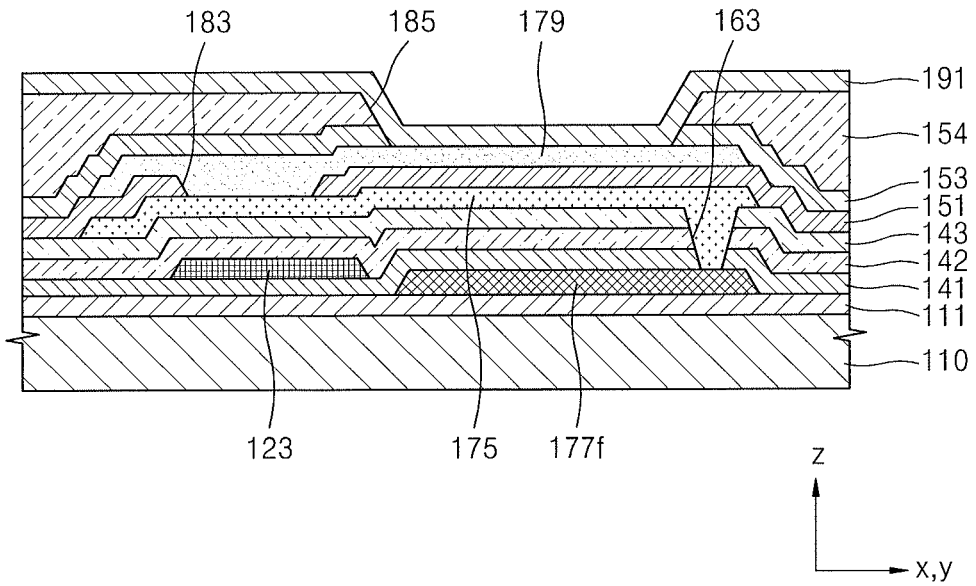
FIG. 9 illustrates a cross-sectional view of a portion of the (sub)pixel, taken along a line IX-IX of FIG. 3.
Figure 10:
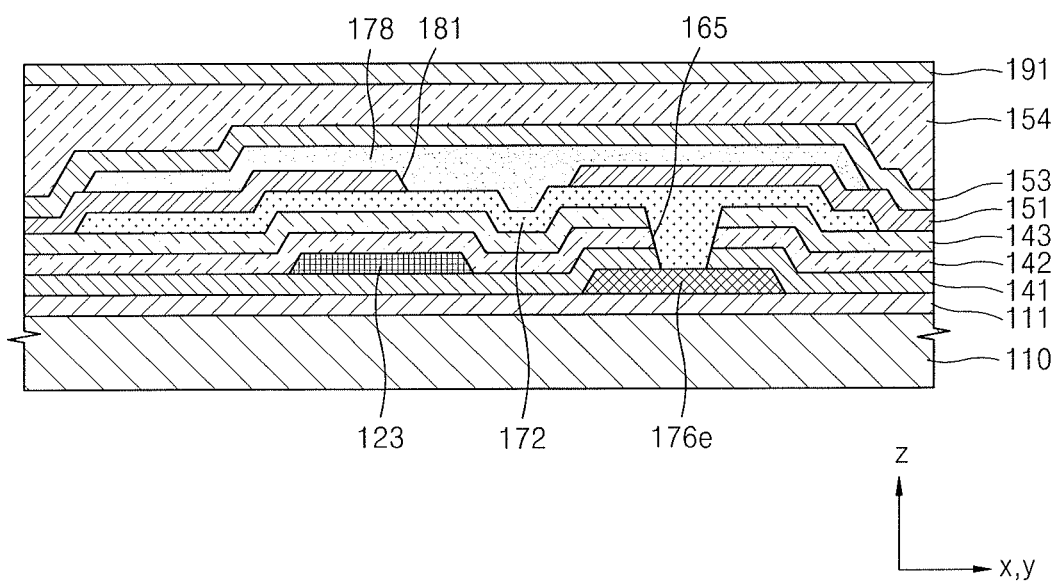
FIG. 10 illustrates a cross-sectional view of a portion of the (sub)pixel, taken along a line X-X of FIG. 3.

FIG. 9 illustrates a cross-sectional view of a portion of the (sub)pixel, taken along a line IX-IX of FIG. 3. FIG. 10 illustrates a cross-sectional view of a portion of the (sub)pixel, taken along a line X-X of FIG. 3. As illustrated in FIGS. 9 and 10, the aforementioned various elements may be located over the substrate 110. The substrate 110 may include a suitable materials such as a glass material, a metal material, a plastic material, or the like. If desired, a buffer layer 111 may be located over the substrate 110. The buffer layer 111 may planarize a surface of the substrate 110, and/or may prevent impurities from penetrating into the semiconductor layer thereon. The buffer layer 111 may have a single-layered structure or a multilayered structure including silicon oxide, silicon nitride, and/or silicon oxynitride.

The driving channel region 131a, the switching channel region 131b, the compensation channel regions 131c1, 131c2, and 131c3, etc., as illustrated in FIG. 4, may be located over the buffer layer 111. The first gate insulating layer 141 including silicon nitride, silicon oxide, and/or silicon oxynitride may be located over the driving channel region 131a, the switching channel region 131b, the compensation channel regions 131c1, 131c2, and 131c3, etc.

Wires such as the driving gate electrode 125a, the scan line 121 the switching gate electrode 125b and the compensation gate electrode 125c, the previous scan line 122 including the initialization gate electrode 125d and the bypass gate electrode 125g, the emission control signal line 123 including the operation control gate electrode 125e and the emission control gate electrode 125f, or the like, as illustrated in FIG. 5, may be located over the first gate insulating layer 141. The driving gate electrode 125a, the scan line 121, the previous scan line 122, and the emission control signal line 123 may be collectively referred to as first gate wiring.

The second gate insulating layer 142 may cover the first gate wiring. The second gate insulating layer 142 may include silicon nitride, silicon oxide, or silicon oxynitride. The second storage capacitor plate 127, the shield layer 126, and the initialization voltage line 124 as illustrated in FIG. 6 may be located over the second gate insulating layer 142. The second storage capacitor plate 127, the shield layer 126, and the initialization voltage line 124 may be collectively referred to as second gate wiring.

The interlayer insulating layer 143 may be over the second gate wiring. The interlayer insulating layer 143 may include silicon nitride, silicon oxide, or silicon oxynitride.

The data line 171, the lower power supply line 172, the initialization connection line 173, the connection member 174, and the middle connection layer 175 as illustrated in FIG. 7 may be located over the interlayer insulating layer 143. The data line 171, the initialization connection line 173, the connection member 174, and the middle connection layer 175 may be collectively referred to as a first conductive layer. The lower power supply line 172 may be located on the same layer as the first conductive layer. When the lower power supply line 172 is located on the same layer as the first conductive layer, the lower power supply line 172 and the first conductive layer may be simultaneously formed. As a result, the lower power supply line 172 may include the same material as the first conductive layer, and may, in some implementations, have a same layered structure as that of the first conductive layer.

The data line 171, the lower power supply line 172, the initialization connection line 173, the connection member 174, and the middle connection layer 175 may be electrically connected to the semiconductor layer below via the contact holes 161, 162, 163, 164, 165, 166, 167, 168, and 169 formed in at least portions of the first gate insulating layer 141, the second gate insulating layer 142, and the interlayer insulating layer 143 as described above.

The first inorganic layer 151 is located over the first conductive layer and the lower power supply line 172. The first inorganic layer 151 may include silicon nitride, silicon oxide, or silicon oxynitride.

The upper power supply line 178 and the auxiliary connection layer 179 as illustrated in FIG. 8 may be located over the first inorganic layer 151. The auxiliary connection layer 179 may be referred to as a second conductive layer. The upper power supply line 178 may be located on the same layer as the second conductive layer. When the upper power supply line 178 is located on the same layer as the second conductive layer, the upper power supply line 178 and the second conductive layer may be simultaneously formed in a manufacturing procedure. As a result, the upper power supply line 178 may include the same material as the second conductive layer, and, in some implementations, may have a same layered structure as that of the second conductive layer.

The upper power supply line 178 and the auxiliary connection layer 179 may be electrically connected to the first conductive layer or the lower power supply line 172 via the contact holes 181 and 183 formed in the first inorganic layer 151. For example, as illustrated in FIG. 10, the first inorganic layer 151 may include an additional opening for the contact hole 181 and thus exposes at least a portion of a first top surface of the lower power supply line 172 under the first inorganic layer 151, such that the upper power supply line 178 may contact the lower power supply line 172 via the additional opening. The first inorganic layer 151 may include a first opening for the contact hole 183 as illustrated in FIG. 9 such that the auxiliary connection layer 179 thereabove may contact the middle connection layer 175.

As described above, the middle connection layer 175, which is a portion of the first conductive layer, may be connected to the semiconductor layer therebelow, for example, to the emission control drain region 177f, via the contact hole 163 formed in at least portions of the first gate insulating layer 141, the second gate insulating layer 142, and the interlayer insulating layer 143. The auxiliary connection layer 179 of the second conductive layer, which is electrically connected to the middle connection layer 175 via the contact hole 183, may also be electrically connected to the semiconductor layer therebelow, for example, to the emission control drain region 177f. In some implementations, in a display apparatus having an equivalent circuit diagram different from that of FIG. 2, if desired, the second conductive layer may be electrically connected to various source regions or drain regions of the semiconductor layer. This characteristic may also applied to embodiments and modified embodiments thereof to be described below.

A second inorganic layer 153 may be located over the second conductive layer and the upper power supply line 178. The second inorganic layer 153 may include silicon nitride, silicon oxide, or silicon oxynitride. The second inorganic layer 153 may cover the second conductive layer and the upper power supply line 178 and may contact the first inorganic layer 151 in a periphery of the second conductive layer. Referring to FIG. 9, the second inorganic layer 153 may cover the auxiliary connection layer 179 and thus may contact the first inorganic layer 151 in a periphery of the auxiliary connection layer 179. Referring to FIG. 10, the second inorganic layer 153 may cover the upper power supply line 178 and thus may contact the first inorganic layer 151 in a periphery of the upper power supply line 178.

A planarization layer 154 may be located over the second inorganic layer 153. The pixel electrode 191 of the organic light-emitting device may be located over the planarization layer 154. The pixel electrode 191 may be connected to the auxiliary connection layer 179 via a second opening formed in the second inorganic layer 153 and the contact hole 185 corresponding to the second opening and formed in the planarization layer 154, such that the pixel electrode 191 may be electrically connected to the emission control drain region 177f.

Referring to FIG. 9, an inner surface of the second opening formed in the second inorganic layer 153 may be equal to an inner surface of the contact hole 185 formed in the planarization layer 154. Thus, the second opening formed in the second inorganic layer 153 and the contact hole 185 formed in the planarization layer 154 may be collectively referred to as the contact hole 185. In some implementations, the inner surface of the second opening formed in the second inorganic layer 153 may not be equal to the inner surface of the contact hole 185 formed in the planarization layer 154. For example, an area of the second opening formed in the second inorganic layer 153 may be greater than an area of the contact hole 185 formed in the planarization layer 154. The planarization layer 154 may include an organic material such as acryl, benzocyclobutene (BCB), polyimide, hexamethyldisiloxane (HMDSO), or the like.

In the display apparatus according to the present embodiment, each of the conductive layers included in the circuit unit in the display area DA may be located to contact an inorganic layer that is directly therebelow. For example, as described above, the first gate wiring including the driving gate electrode 125a, the scan line 121, the previous scan line 122, and the emission control signal line 123 as illustrated in FIG. 5 may be located over the first gate insulating layer 141. The second gate wiring including the second storage capacitor plate 127, the shield layer 126, and the initialization voltage line 124 as illustrated in FIG. 6 may be located over the second gate insulating layer 142. The first conductive layer including the data line 171, the initialization connection line 173, the connection member 174, and the middle connection layer 175 as illustrated in FIG. 7, and the lower power supply line 172 may be located over the interlayer insulating layer 143. The second conductive layer including the auxiliary connection layer 179, and the upper power supply line 178 may be located over the first inorganic layer 151. The first gate insulating layer 141, the second gate insulating layer 142, the interlayer insulating layer 143, and the first inorganic layer 151 may be inorganic layers.

When wires are variously patterned, a conductive layer over an entire surface of the substrate 110 may be patterned and partially removed. If removal-target portions are not correctly removed, elements that are not supposed to be electrically connected to each other could be connected, causing an occurrence of short, so that a defect could occur in the display apparatus.

When a conductive layer is formed over an organic layer, is patterned, and then is partially removed, removal-target portions may not be correctly removed. For example, if the conductive layer includes titanium, the titanium could react with an organic material therebelow such that a titanium oxide layer may be formed over an interface between the conductive layer and the organic layer. During a patterning process, a removal-target portion of the conductive layer including titanium may be removed but the titanium oxide layer therebelow may not be removed but may remain. As a result, elements that are not supposed to be electrically connected to each other could be connected, causing an occurrence of short, such that a defect may occur in the display apparatus.

In particular, when the number of electronic devices such as a TFT included in each (sub)pixel is increased to embody a display apparatus that displays a high quality image, or when an area of each (sub)pixel is decreased to embody a high-resolution display apparatus, a gap between various types of wires in the display area DA may become smaller than a gap between wires in a display area of a general display apparatus. In this case, a defect rate due to the remaining titanium oxide layer may be sharply increased.

However, in the display apparatus according to the present embodiment, as described above, the conductive layers in the display area DA contact inorganic layers provided directly below the conductive layers, respectively. For example, a bottom surface of each of the conductive layers may be located for a surface-to-surface contact with an inorganic layer directly therebelow. Therefore, it may be possible to effectively prevent an occurrence of a defect during a process of patterning the conductive layers.

As described above, the second inorganic layer 153 over the second conductive layer and the upper power supply line 178 may cover the second conductive layer and thus may contact the first inorganic layer 151 in a periphery of the second conductive layer. Referring to FIG. 9, the second inorganic layer 153 may cover the auxiliary connection layer 179 and thus may contact the first inorganic layer 151 in the periphery of the auxiliary connection layer 179. Referring to FIG. 10, the second inorganic layer 153 may cover the upper power supply line 178 and thus, may contact the first inorganic layer 151 in the periphery of the upper power supply line 178. The planarization layer 154 may be located over the second inorganic layer 153, and the pixel electrode 191 of the organic light-emitting device may be located over the planarization layer 154.

When a general display apparatus is manufactured or is used after the manufacture, an impurity such as a gas could be generated from the planarization layer 154 including an organic material and thus could damage the TFTs. However, in the display apparatus according to the present embodiment, as described above, the first inorganic layer 151 covers the first conductive layer, the second inorganic layer 153 covers the second conductive layer, and the first inorganic layer 151 and the second inorganic layer 153 contact each other. The first inorganic layer 151 and the second inorganic layer 153 in this structure may function as a protection layer to prevent an impurity such as a gas generated from the planarization layer 154 from damaging the TFTs below the planarization layer 154.

Figure 11:
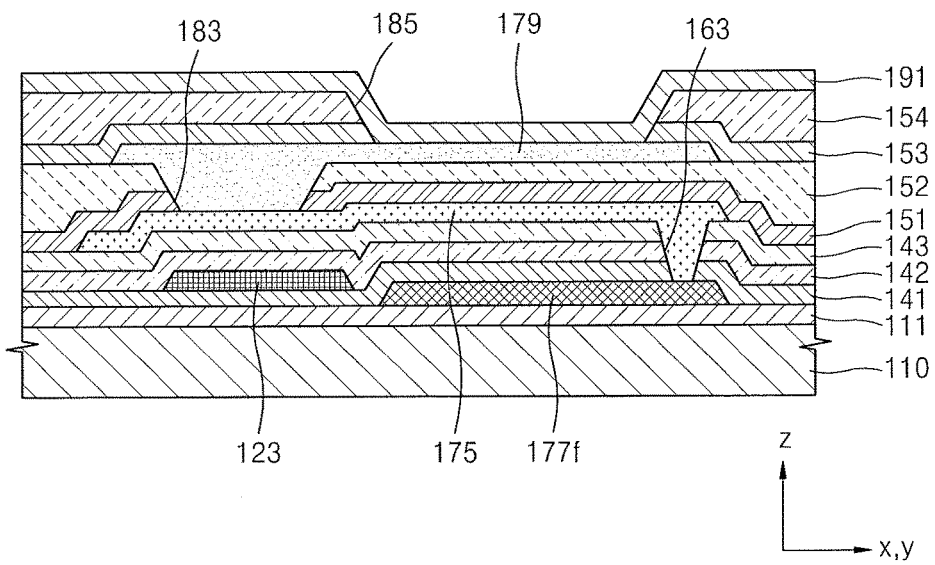
FIGS. 11 and 12 illustrate cross-sectional views of portions of a display apparatus, according to another embodiment.
Figure 12:
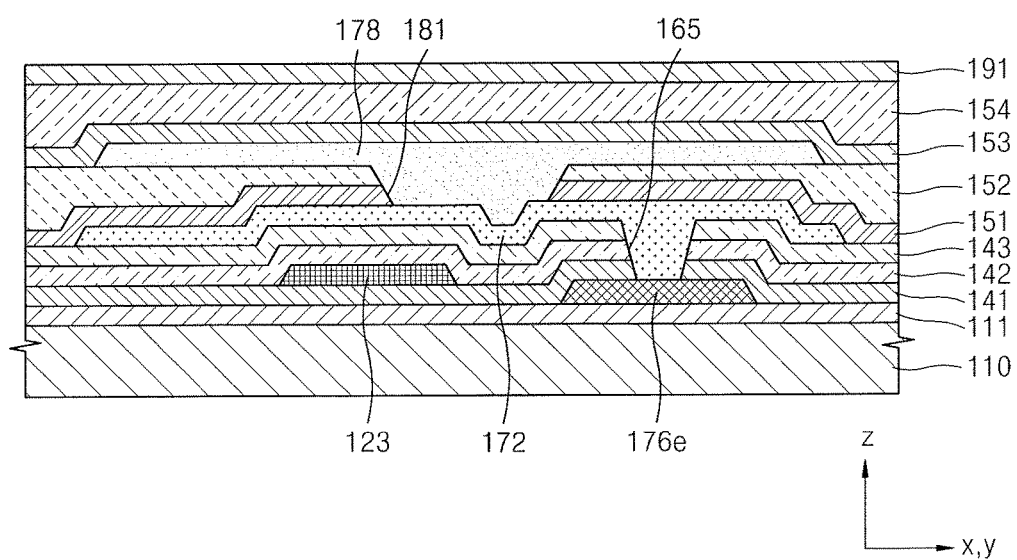

According to the aforementioned descriptions, the second conductive layer including the auxiliary connection layer 179, and the upper power supply line 178 are located over the first inorganic layer 151. In some implementations, as illustrated in FIGS. 11 and 12, which are cross-sectional views of portions of a display apparatus according to another embodiment, an organic material layer 152 may be located over the first inorganic layer 151, and the second conductive layer including the auxiliary connection layer 179, and the upper power supply line 178 may be located over the organic material layer 152. The organic material layer 152 may include acryl, benzocyclobutene (BCB), polyimide, hexamethyldisiloxane (HMDSO), or the like. The organic material layer 152 may have a flat top surface, even if the lower power supply line 172 is present therebelow.

When a size of the display apparatus is increased, the display area DA is also increased such that an area of each (sub)pixel may be increased. In this case, a gap between the second conductive layer including the auxiliary connection layer 179, and the upper power supply line 178 may be increased, such that, even if the second conductive layer and the upper power supply line 178 are located over the organic material layer 152, short may not occur therebetween. As illustrated in FIGS. 11 and 12, the second conductive layer including the auxiliary connection layer 179, and the upper power supply line 178 may be located over the organic material layer 152 having the flat top surface.

Figure 13:
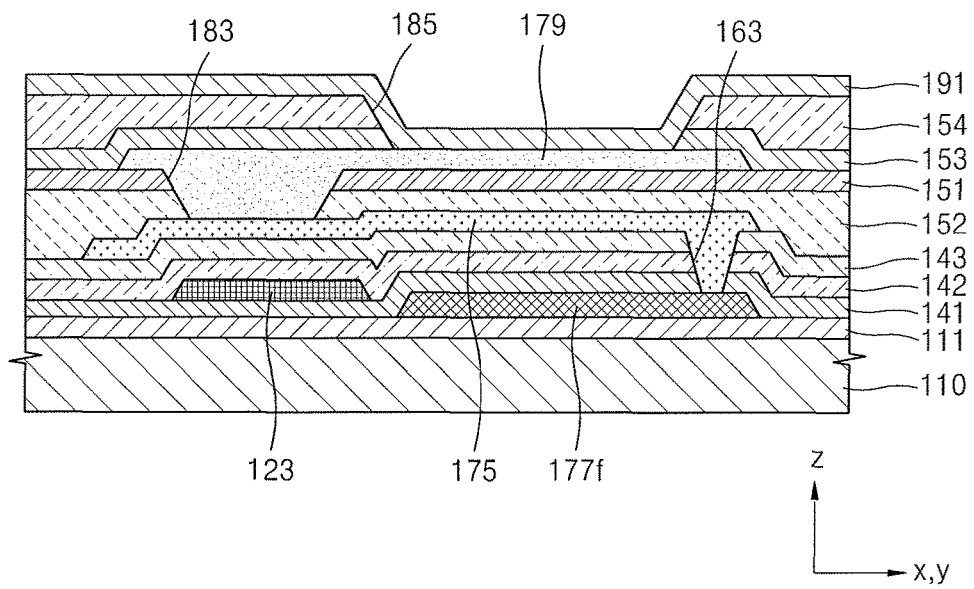
FIGS. 13 and 14 illustrate cross-sectional views of portions of a display apparatus, according to another embodiment.
Figure 14:
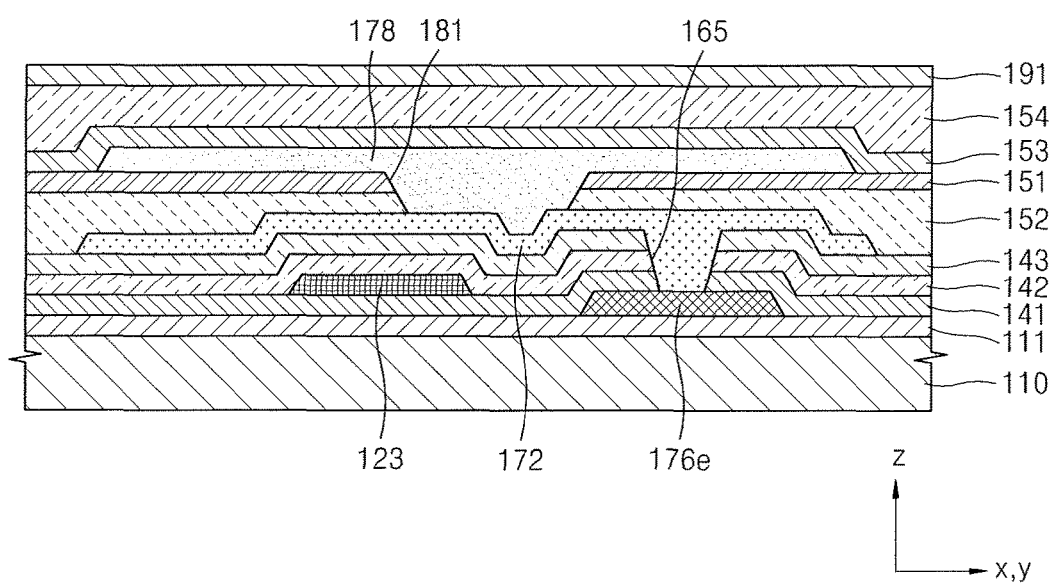

However, if the large-size display apparatus is a ultra high-definition display apparatus, the area of each (sub)pixel may be decreased. In this case, as illustrated in FIGS. 13 and 14, which are cross-sectional views of portions of a display apparatus according to another embodiment, the organic material layer 152 may be located under the first inorganic layer 151, preventing an occurrence of a defect when the second conductive layer and the upper power supply line 178 are formed. For example, the organic material layer 152 may cover the first conductive layer and the lower power supply line 172, and the first inorganic layer 151 may be located over the organic material layer 152. Accordingly, the second conductive layer and the upper power supply line 178 may be located directly over the first inorganic layer 151. In this case, the second inorganic layer 153 covering the second conductive layer and the upper power supply line 178 may directly contact the first inorganic layer 151 in a periphery of the second conductive layer or in a periphery of the upper power supply line 178.

By way of summation and review, a general display apparatus may experience irregular luminance. In particular, when a display area of the display apparatus is increased, even if a control signal is applied to a plurality of pixels so as to allow the pixels to emit light with uniform luminance, light with irregular luminance may be emitted according to positions of the pixels.

Embodiments provide a display apparatus capable of displaying a high-quality image, by minimizing an irregularity in luminance of the display apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A display apparatus comprising:
a plurality of pixel electrodes;
a plurality of circuit units in one-to-one correspondence with the plurality of pixel electrodes, respectively, each of the plurality of circuit units being electrically connected to a corresponding one of the plurality of pixel electrodes;
a plurality of lower power supply lines extending in one direction, each of the plurality of lower power supply lines being electrically connected to a corresponding circuit unit from among the plurality of circuit units; and
a plurality of upper power supply lines extending in the one direction, a layer on which the upper power supply lines are disposed being over a layer on which the plurality of lower power supply lines are disposed, and the upper power supply lines being electrically connected to the plurality of lower power supply lines.

2. The display apparatus as claimed in claim 1, wherein:
the plurality of upper power supply lines are in one-to-one correspondence with the plurality of lower power supply lines.

3. The display apparatus as claimed in claim 1, wherein the plurality of upper power supply lines are electrically connected to each other by branch lines that extend in another direction crossing the one direction.

4. The display apparatus as claimed in claim 1, wherein the plurality of lower power supply lines and the plurality of upper power supply lines are electrically connected to each other at locations corresponding to the plurality of pixel electrodes.

5. The display apparatus as claimed in claim 1, wherein the plurality of lower power supply lines and the plurality of upper power supply lines are electrically connected to each other at locations corresponding to some pixel electrodes from among the plurality of pixel electrodes.

6. The display apparatus as claimed in claim 1, wherein:
the plurality of pixel electrodes are located in a display area of the display apparatus, and
the plurality of lower power supply lines and the plurality of upper power supply lines are electrically connected to each other at points that are randomly located in the display area.

7. The display apparatus as claimed in claim 1, wherein each of the plurality of circuit units includes a plurality of thin film transistors (TFTs) including a driving TFT, a switching TFT, a compensation TFT, an initialization TFT, a driving control TFT, an emission control TFT, and a bypass TFT.

8. The display apparatus as claimed in claim 1, wherein the upper power supply lines directly contact the corresponding lower supply lines through contact holes.

9. The display apparatus as claimed in claim 1, wherein the upper power supply lines overlap the corresponding lower supply lines.

10. The display apparatus as claimed in claim 1, further comprising a plurality of data lines parallel to the lower supply lines and being on a same layer as the lower supply lines.

11. A display apparatus comprising:
a plurality of pixel electrodes;
a plurality of circuit units in one-to-one correspondence with the plurality of pixel electrodes, respectively, each of the plurality of circuit units being electrically connected to a corresponding one of the plurality of pixel electrodes;
a plurality of lower power supply lines extending in one direction, each of the plurality of lower power supply lines being electrically connected to a corresponding circuit unit from among the plurality of circuit units; and
a plurality of upper power supply lines extending in the one direction, the upper power supply lines being over the plurality of lower power supply lines, and electrically connected to the plurality of lower power supply lines,
wherein:
each of the plurality of circuit units includes a first conductive layer and a second conductive layer, the second conductive layer being over the first conductive layer,
each of the plurality of lower power supply lines is on a same layer as the first conductive layer, and
each of the plurality of upper power supply lines is on a same layer as the second conductive layer.

12. The display apparatus as claimed in claim 11, wherein:
each of the plurality of lower power supply lines includes a same material as that of the first conductive layer, and
each of the plurality of upper power supply lines includes a same material as that of the second conductive layer.

13. The display apparatus as claimed in claim 11, wherein:
the first conductive layer has a layered structure;
each of the plurality of lower power supply lines has a same layered structure as the first conductive layer,
the second conductive layer has a layered structure, and
each of the plurality of upper power supply lines has a same layered structure as the second conductive layer.

14. The display apparatus as claimed in claim 11, further comprising an insulating layer between the first conductive layer and the second conductive layer and between the plurality of lower power supply lines and the plurality of upper power supply lines, wherein:
the insulating layer includes openings to expose portions of top surfaces of the plurality of lower power supply lines, and
the plurality of lower power supply lines contact corresponding one of the plurality of upper power supply lines via corresponding one of the openings.

15. The display apparatus as claimed in claim 14, wherein the insulating layer is an inorganic layer.

16. The display apparatus as claimed in claim 1, wherein one of the plurality of lower power supply lines is electrically connected to corresponding one of the plurality of upper power supply lines at a plurality of locations.

17. A display apparatus comprising:
a plurality of pixel electrodes;
a plurality of circuit units in one-to-one correspondence with the plurality of pixel electrodes, respectively, each of the plurality of circuit units being electrically connected to a corresponding one of the plurality of pixel electrodes;
a plurality of lower power supply lines extending in one direction, each of the plurality of lower power supply lines being electrically connected to a corresponding circuit unit from among the plurality of circuit units; and
plurality of upper power supply lines extending in the one direction, the upper power supply lines being over the plurality of lower power supply lines, and electrically connected to the plurality of lower power supply lines,
wherein each of the plurality of circuit units includes a compensation TFT,
wherein:
the compensation TFT of one circuit unit of the plurality of circuit units includes a compensation channel region located next to a boundary of the one circuit unit and an adjacent circuit unit,
a data line of the adjacent circuit unit is located in the adjacent circuit unit next to the boundary of the one circuit unit and the adjacent circuit unit, and
a shield layer extends across the boundary of the one circuit unit and the adjacent circuit unit, the shield layer preventing parasitic capacitance from being generated between the compensation channel region of the one circuit unit and the data line of the adjacent circuit unit.

18. The display apparatus as claimed in claim 17, wherein the shield layer is electrically connected to a lower power supply line of the plurality of lower power supply lines and insulated from the compensation channel region of the one circuit unit and from the data line of the adjacent circuit unit.

* * * * *